United States Patent
Deboy et al.

(10) Patent No.: US 6,465,863 B1
(45) Date of Patent: Oct. 15, 2002

(54) POWER DIODE STRUCTURE

(75) Inventors: Gerald Deboy, Unterhaching; Jens-Peer Stengl, Grafrath, both of (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/701,527
(22) PCT Filed: May 12, 1999
(86) PCT No.: PCT/DE99/01453
§ 371 (c)(1),
(2), (4) Date: Mar. 12, 2001
(87) PCT Pub. No.: WO99/62123
PCT Pub. Date: Dec. 2, 1999

(30) Foreign Application Priority Data

May 28, 1998 (DE) .......................................... 198 23 944

(51) Int. Cl.$^7$ .............................................. H01L 23/58
(52) U.S. Cl. ....................................... 257/495; 257/653
(58) Field of Search ................................. 257/495, 341, 257/653

(56) References Cited

U.S. PATENT DOCUMENTS

| 4,003,072 A | 1/1977 | Matsushita et al. |
| 4,134,123 A | 1/1979 | Shannon |
| 4,158,206 A | 6/1979 | Neilson |
| 4,654,679 A | 3/1987 | Muraoka |
| 4,777,521 A | 10/1988 | Coe |
| 5,438,215 A | * 8/1995 | Tihanyi ........................ 257/341 |
| 6,081,009 A | * 6/2000 | Neilson ........................ 257/495 |
| 6,091,108 A | * 7/2000 | Harris et al. ................. 257/495 |

FOREIGN PATENT DOCUMENTS

| EP | 0 426 252 A2 | 5/1991 |
| EP | 0 565 350 A2 | 10/1993 |
| JP | 1-93169 A | 4/1989 |
| JP | 3-174775 A | 7/1991 |
| JP | 09 246 570 A | 9/1997 |
| JP | 10 117 003 A | 5/1998 |
| JP | 10 135 489 A | 5/1998 |
| WO | WO 98/32177 | 7/1998 |

OTHER PUBLICATIONS

A. Porst et al.: "Improvement Of The Diode Characteristics Using Emitter–Controlled Principles (EMCON–Diode)", IEEE 1997, pp. 213–216.

* cited by examiner

Primary Examiner—Mark V. Prenty
(74) Attorney, Agent, or Firm—Laurence A. Greenberg; Werner H. Stemer; Ralph E. Locher

(57) ABSTRACT

The invention relates to a power diode structure having improved dynamic characteristics which comprises a semiconductor body of a first conduction type. A semiconductor zone of the other conduction type which is contrary to the first conduction type is embedded in the one surface of said semiconductor body. The power diode also comprises an anode which contacts the semiconductor zone, and has a cathode which contacts the semiconductor body. At least one floating region of the second conduction type is provided in the semiconductor body.

12 Claims, 3 Drawing Sheets

POWER DIODE STRUCTURE

BACKGROUND OF THE INVENTION

Field of the Invention

The present invention relates to a power diode structure having improved dynamic properties, having a semiconductor body of one conduction type, whose one surface has an embedded semiconductor zone of the other conduction type, which is the opposite of the first conduction type, having a first electrode making contact with the semiconductor zone and having a second electrode making contact with the semiconductor body.

A. Porst, F. Auerbach, H. Brunner, G. Deboy and F. Hille, "Improvement of the diode characteristics using emitter controlled principles (Emcon-Diode)", Proc. ISPSD 1997, pages 213–216 (1997) describes a power diode in which special adjustment of the charge carrier distribution in the central area of the diode influences the diode's static and dynamic response by combining the so-called Hall and Kleinmann principles.

In addition, U.S. Pat. No. 4,134,123 discloses a high voltage Schottky diode in which floating p-conductive regions are embedded in an n-conductive semiconductor body with a Schottky contact, as a result of which the reverse characteristic of the diode is significantly improved.

Finally, EP 0 565 350 B1 discloses a diode in which a buffer layer containing alternating regions of high and low conductivity is connected to an anode region, each region of low conductivity essentially being depleted by a diffusion potential prevailing between this region and the adjacent region of high conductivity. This is intended to achieve a high level of injection effectiveness for holes from the anode region when the buffer layer has a low specific resistance.

SUMMARY OF THE INVENTION

The object of the present invention is to provide a power diode structure in which the stored charge is reduced to minimize the overall losses, in which the fast recovery response is also improved, so that voltage is rapidly taken up and hence there is a low reverse current surge, and in which the soft recovery response is also improved, so that no current chopping occurs during commutation and there is good attenuation of overvoltage spikes, and which is distinguished by good forward properties with as small a temperature response as possible for the forward characteristic curve and the stored charge.

To achieve this object, a power diode structure of the type mentioned in the introduction is distinguished, according to the invention, in that at least one floating region of the second conduction type is provided in the semiconductor body.

In contrast to the existing power diodes based on the prior art, the power diode structure according to the invention contains, when the semiconductor body is n-conductive, for example, regions in the rear area of the. n-conductive drift path which are of the opposite conduction type, that is to say p-conductive floating regions, which may be of spherical, columnar or otherwise any desired design. In this case, the doping of these floating regions is chosen such that, in the lateral direction of the power diode, that is to say in the direction perpendicular to the direction of connection between the first electrode or anode and the second electrode or cathode, the material-specific breakdown charge is exceeded neither in the p-conductive floating regions nor in the regions of the n-conductive semiconductor body which are situated between them. This breakdown charge is approximately $2 \times 10^{12}$ cm$^{-2}$ for silicon. In this case, doping which is approximately in the order of magnitude of half the breakdown charge, i.e. approximately $10^{12}$ cm$^{-2}$ in the case of silicon, is particularly expedient.

The semiconductor body outside the area of the floating regions, and hence the homogeneously doped part of the drift path, may advantageously be more highly doped than in existing power diodes. One example which may be mentioned in this case for a power diode having a rated voltage in the order of magnitude of 600 V is a doping concentration for the drift path of $8 \cdot 10^{14}$ cm$^{-2}$ with a layer thickness of approximately 25 $\mu$m for silicon. It has been found that, with such a design, the edge of the space charge zone then reaches the area of the floating regions at approximately 300 V. On account of the higher level of doping in the drift path, a smaller area of the drift path must then be depleted in order to take up a particular voltage of, by way of example, 200 V, with the result that less charge must be moved for the same flooding with charge carriers.

A power diode structure designed in this manner is distinguished by a lower reverse current surge with more rapid voltage takeup, as compared with the prior art, with the result that an improved fast recovery response is achieved overall.

The power diode structure according to the invention is advantageously designed such that the floating regions are reached by the space charge zone when approximately 80% of the usual operating voltage, that is to say not of the maximum voltage of the power diode, is applied, which is approximately 300 to 400 V in the case of 600 V power diodes, for example.

In this case, the space charge zone first extends relatively rapidly in the area of the floating regions, with the result that a further voltage rise is hindered by a relatively large amount of charge carriers flowing away. Hence, good attenuation of the commutation procedure is achieved in the phase after the reverse current surge has been exceeded.

The degree of compensation of the semiconductor body in the area of the floating regions is expediently set such that significant extra weight is produced for the doping of the floating regions. This means that, if, by way of example, p-conductive columnar regions in an n-conductive semiconductor body are used for the floating regions, a significantly p-weighted net doping is intended to appear in the area of the p-conductive columnar regions. The effect achieved by this is that the electrical field recovers without any problem, which means that the layer thickness required for taking up the rated voltage, for example 630 V, in the semiconductor body can be kept relatively small.

In summary, the doping in the floating regions and their surrounding regions of the semiconductor body is primarily limited by the demand for the breakdown charge not to be exceeded, as was explained above. This means that, in the case of silicon, the doping should be chosen such that the lateral charge integral of $2 \cdot 10^{12}$ cm$^{-2}$ is not exceeded. Preferably, the doping is chosen such that the lateral charge integral is in the region of half the breakdown charge.

If the floating regions and their surrounding regions of the semiconductor body are patterned to an appropriately fine degree, doping concentrations in the region of $10^{15}$ cm$^{-3}$ and above can be set. In particular, the doping concentration in the floating regions may become so high that these regions are no longer flooded by charge carriers. The attenuation of the commutation procedure is then endured only by the charge carriers stored in the floating regions, that is to say by holes in the example above, which then flow through the space charge zone as a minority charge carrier current. This minority charge carrier current is independent of the diode flooding or of the current in the freewheeling circuit. Hence, the commutation response of the power diode structure at low current densities is improved.

If the floating regions are sufficiently more highly doped -20 than their surrounding regions of the semiconductor body, with the result that the doping is p-weighted in the example above, then some of the floating regions before the cathodic n-conductive emitter are not depleted, even at the rated voltage. This makes it possible to design the cathode in the form of a "transparent emitter" for the hole currents, so that recombination of the holes occurs only at the rear metal contact of the cathode, and not in an $n^+$-conductive contact region before the cathode. In this case, however, the doping concentration in the rear area of the n-conductive semiconductor body between the floating regions close to the cathode should be chosen to be appropriately high in order to prevent field punchthrough to the metal contact of the cathode.

If, as explained above, the respective doping in the floating regions and in their surrounding regions of the semiconductor body is chosen to be so high that this area is not flooded with charge carriers, then the electron currents and the hole currents are split into various path regions. The emitter effectiveness at the cathode is then determined only by the n-charge between the end of the floating p-conductive regions and the metal contact of the cathode in the example above. This means that the rear suspension point for the charge carrier distribution in the flooded state of the power diode structure can be lowered to a relatively large extent, which results in a correspondingly low stored charge.

As in the case of the conventional Emcon diode mentioned in the introduction, the principle explained above for a transparent emitter permits a relatively slight reduction in the charge carrier lifetime in the base, as a result of which it is possible to achieve small leakage currents and, in particular, a low temperature dependency for the forward characteristic curve, possibly even a positive temperature coefficient for the forward voltage drop. This advantage arises particularly when a plurality of power diode structures are connected in parallel. Similarly, the stored charge is practically independent of temperature.

On account of the majority charge carrier transportation of electrons and holes in the semiconductor body in the region around the floating regions or in the floating regions themselves, the floating regions make no significant contribution to the forward losses in the power diode structure. This means that the forward properties of the power diode structure are at least not impaired by the floating regions.

As already explained above, the floating regions can be designed to be columnar, spherical, ellipsoidal etc. In this context, they may form strip designs, cell designs with a square or hexagonal arrangement, or else may be provided in a lattice shape.

The principle explained above for the power diode structure according to the invention can also readily be applied to p-channel or n-channel MOSFETs, to JFETs, bipolar transistors and thyristors. It is also possible to use other semiconductor materials than silicon, such as GaAs or SiC.

The floating regions themselves may, for example, be produced by multiple epitaxy and/or repeated and masked ion implantation operations or else by etching and filling trenches or by high energy ion implantation operations.

BRIEF DESCRIPTION OF THE DRAWINGS

The invention is explained in more detail below with the aid of the drawings, in which.

DESCRIPTION OF THE PREFERRED EMBODIMENTS

Figure 1:
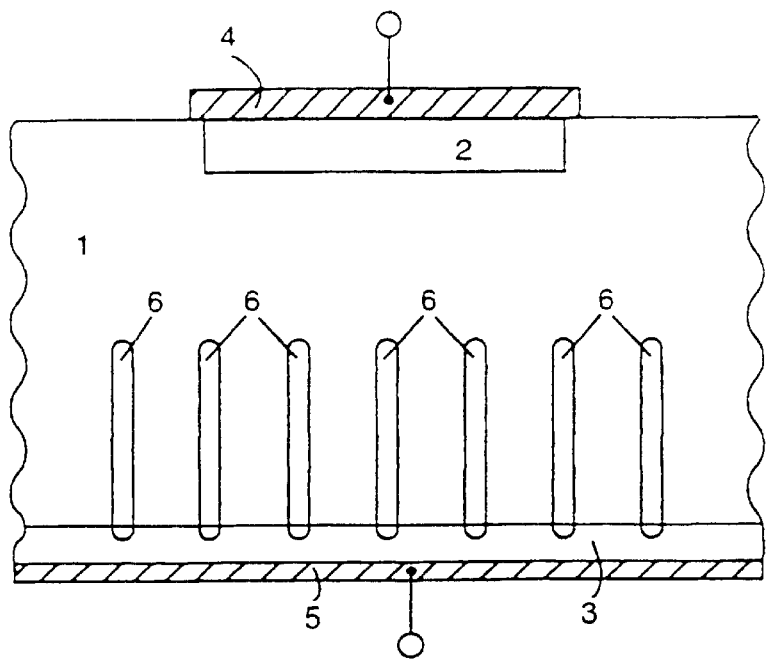
FIG. 1 shows a first illustrative embodiment of the power diode structure according to the invention.

FIG. 1 shows a power diode structure having an $n^-$-conductive semiconductor body 1, a p-conductive semiconductor zone 2, an n-conductive contact zone 3, an anode contact 4 and a cathode contact 5.

According to the invention, columnar floating p-conductive regions 6 are embedded in the semiconductor body 1. These regions 6 may possibly also be of spherical, ellipsoidal or of other design.

However, it is important that the doping of these regions 6 is chosen such that, in the lateral direction, that is to say perpendicular to the direction of connection between the anode 4 and the cathode 5, the specific breakdown charge of the semiconductor material, that is to say approximately $2 \cdot 10^{12}$ cm$^{-2}$ for silicon, is exceeded neither in the p-conductive regions 6 nor in the regions of the semiconductor body 1 which are situated between them. A suitable value is $1 \cdot 10^{12}$ cm$^{-2}$ for silicon, for example.

The area of the semiconductor body 1 between the regions 6 and the semiconductor zone 2, that is to say the "upper" homogeneously doped part of the drift path, can be more highly doped in comparison to existing power diode structures and, for a 600 V power diode, for example, may be in the region of $8 \cdot 10^{14}$ cm$^{-3}$ with a layer thickness of approximately 25 $\mu$m.

Figure 2:
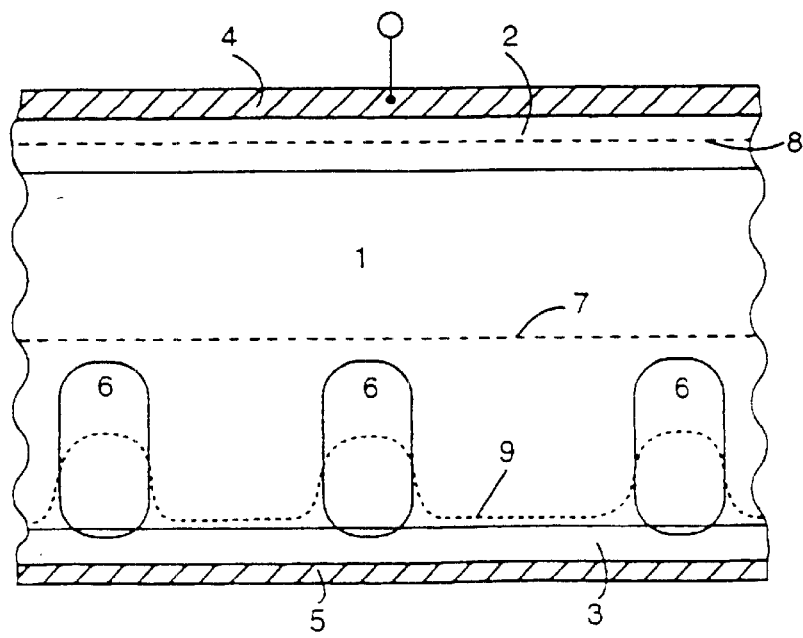
FIG. 2 shows the profile of the space charge zone in the power diode structure of FIG. 1 when a voltage of 300 V and 600 V is applied to the power diode structure.

In the case of such a design, the edge of the space charge zone then extends into the area of the p-conductive regions 6 at approximately 300 V, as illustrated by a dashed line 7 in FIG. 2. The boundary of the space charge zone in the semiconductor zone 2 is indicated by a dashed line 8, while the profile of the space charge zone in the semiconductor body 1 at 600 V is shown by a dotted line 9.

Figure 3:
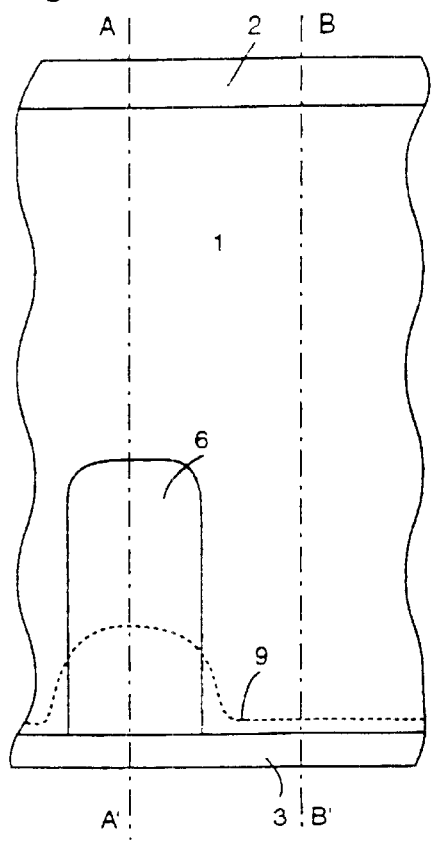
FIG. 3 shows the profile of the electrical field strength in the power diode structure for reverse biasing.
Figure 3:
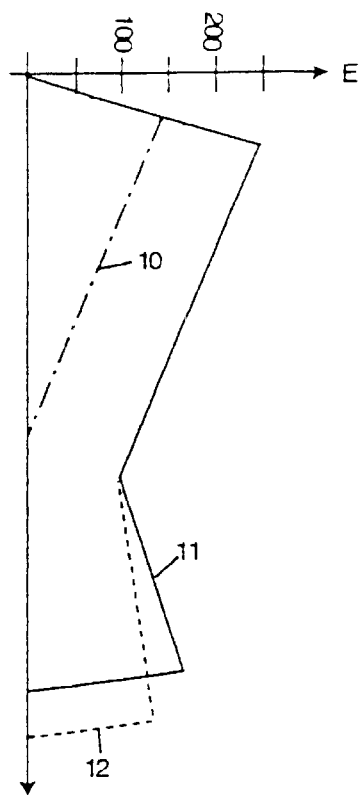

In the power diode structure according to the invention, the higher doping means that a smaller area of the drift path must be depleted of charge carriers in order to take up a particular voltage, which, as already explained above, results in an improved fast recovery response. The right-hand half of FIG. 3 shows the profile of the electrical field strength E in kV/cm in sectional planes A–A' and B–B' in the structure of FIG. 2. In this case, a curve 10 indicates the electrical field strength for 300 V between the anode 4 and the cathode 5, while a curve 11 shows the field strength in the sectional plane A–A' at an applied voltage of 600 V and a curve 12 shows the electrical field strength in sectional plane B–B' likewise at an applied voltage of 600 V.

The recovery of the electrical field strength (cf. curves 11 and 12 in FIG. 3) is achieved as a result of a significantly p-weighted net doping in the area of the p-conductive floating regions 6 and their surrounding regions of the semiconductor body 1. This allows the layer thickness required for taking up the rated voltage to be kept relatively small.

Figure 4:
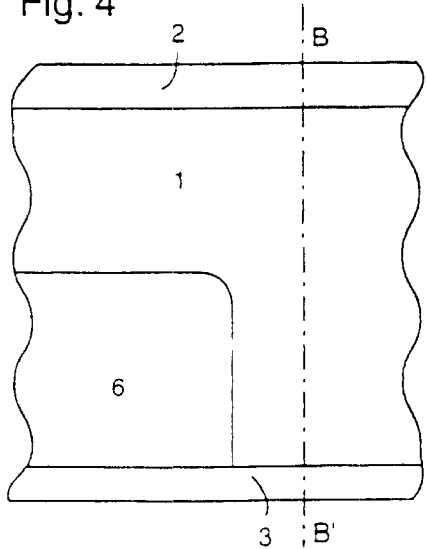
FIG. 4 shows the profile of the charge carrier concentration in the power diode structure for forward biasing.
Figure 4:
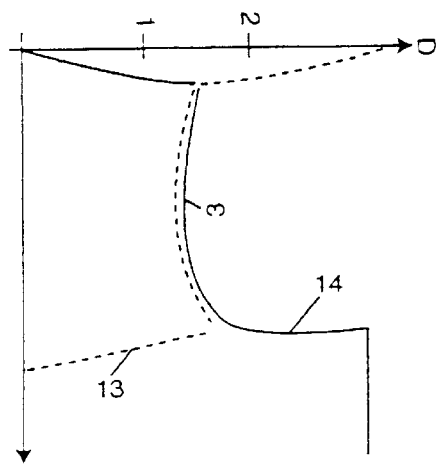
Figure 5:
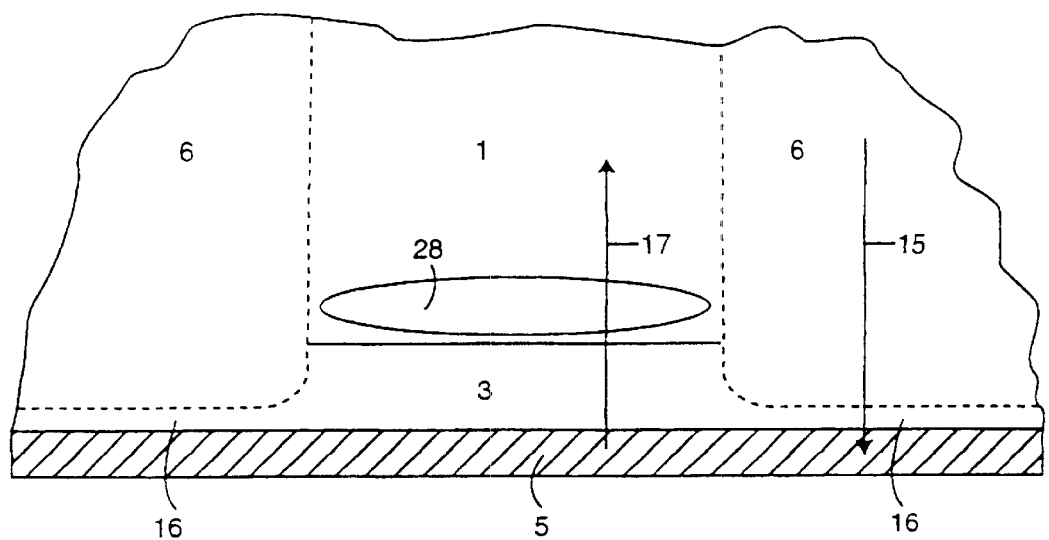
FIG. 5 shows a detail illustration to explain a transparent emitter.

FIG. 4 illustrates the profile of the charge carrier concentration in the power diode structure of FIG. 2 with forward biasing when the doping D (cf. the right-hand half of FIG. 4) is approximately $3 \cdot 10^{16}$ cm$^{-3}$. Thus, a profile shown by a curve 13 is produced on the sectional plane B–B' (cf. the left-hand half of FIG. 4) for the p-doping, while the n-doping is illustrated by a curve 14. If the area of the p-conductive regions 6 is of sufficiently p-weighted design, some of the regions 6 before the rear n-emitter are not depleted even when the rated voltage is applied, which makes it possible to design the cathode in the form of a transparent emitter for the hole currents. In other words, recombination of the holes first takes place at the metal contact of the cathode 5, as illustrated in FIG. 5 by an arrow 15 for the hole current. There is thus a "transparent emitter" 16 for the hole current (cf. the arrow 15).

In the cathodic area of the n-conductive semiconductor body 1 between the regions 6, the doping in a region 28 (n$^+$) must in the above case be chosen to be higher than in the surrounding areas in order to prevent field punchthrough to the metal contact of the cathode 5.

In the arrangement of FIG. 5, the hole currents (arrow 15) and the electron currents (cf. arrow 17) are split into various path regions, so that the emitter effectiveness is determined only by the n-conductive charge between the end of the p-conductive regions 6 and the metal contact of the cathode 5.

Figure 6:
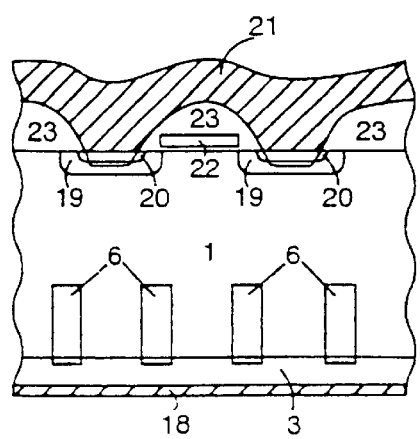
FIG. 6 shows an application of the inventive power diode structure to a MOSFET and, FIG. 7 shows an application of the inventive power diode structure to a GTO thyristor.

FIG. 6 shows an application of the inventive power diode structure to a MOSFET (n-channel) having a drain electrode 18, a p-conductive well 19, an n$^+$-conductive source zone 20, an aluminum source metalization 21, a gate electrode 22 and an insulating layer 23.

Figure 7:
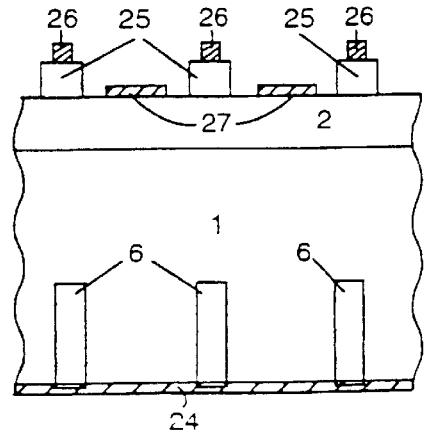

FIG. 7 shows an application of the inventive power diode structure to a GTO thyristor having a metalization 24, n$^+$-conductive regions 25, metal contacts 26 and metal contacts 27.

We claim:

1. A power diode structure having improved dynamic properties, comprising;
   a semiconductor body (1) of a first conduction type;
   an embedded semiconductor zone (2) of a second conduction type opposite to said first conduction type on a first surface of said semiconductor body (1);
   a first electrode (4), making contact with said semiconductor zone (2), on said first surface of said semiconductor body (1);
   a second electrode (5) making contact with said semiconductor body (1) on a second surface of said semiconductor body (1), opposite to said first surface;
   a contact zone (3) of said first conduction type adjacent said second electrode (5);
   at least one floating region (6) of said second conduction type spaced apart to said semiconductor zone (2) and reaching to said contact zone (3); and
   a doping, in a lateral direction perpendicular to a direction of connection between said first and second electrodes (4, 5), in said at least one floating region (6) and regions adjoining said at least one floating region of said semiconductor body (1) not exceeding a material-specific breakdown charge.

2. The power diode. structure as claimed in claim 1, wherein said breakdown charge for said semiconductor body (1) made of silicon is below $2 \times 10^{12}$ cm$^{-2}$.

3. The power diode structure as claimed in claim 1, wherein said doping is chosen such that a charge integrated in said lateral direction is approximately in the order of magnitude of half of said breakdown charge.

4. The power diode structure as claimed in claim 1, wherein said semiconductor body (1) is more highly doped outside said at least one floating region (6) than in the area of said at least one floating region (6).

5. The power diode structure as claimed in claim 4, wherein said semiconductor body (1) outside said at least one floating region (6) is provided with a doping concentration of approximately $8 \times 10^{14}$ cm$^{-3}$ with a layer thickness of approximately 25 μm.

6. The power diode structure as claimed in claim 1, wherein said at least one floating region (6) is reached by a space charge zone when a voltage of 80% of the rated voltage of the power diode structure is applied.

7. The power diode structure as claimed in claim 1, wherein said at least one floating region (6) is more highly doped than their adjoining regions of said semiconductor body (1).

8. The power diode structure as claimed in claim 7, wherein said at least one floating region (6) is so highly doped that it is at least to some extent not depleted of charge carriers when the rated voltage of the power diode structure is applied, so that said second electrode (5) acts as a transparent emitter for currents having charge carriers of said second conduction type, where recombination of these charge carriers of said second conduction type first takes place at said second electrode (5).

9. The power diode structure as claimed in claim 8, wherein said at least one floating region is at least two floating regions, and said semiconductor body (1) in a area between said at least two floating regions (6) close to said second electrode (5) is more highly doped than in the surrounding areas.

10. the power diode structure as claimed in claim 1, wherein said at least one floating region (6) is in columnar form, spherical form or ellipsoidal form in a square or hexagonal arrangement.

11. The power diode structure as claimed in claim 1, wherein said semiconductor body is made of Si or SiC or GaAs.

12. The power diode structure as claimed in claim 1 for pn-junctions of MOSFETs, JFETs, bipolar transistors or thyristors.

* * * * *